(12) United States Patent
Tsau et al.

(10) Patent No.: US 9,287,372 B2
(45) Date of Patent: Mar. 15, 2016

(54) METHOD OF FORMING TRENCH ON FINFET AND FINFET THEREOF

(71) Applicant: Taiwan Semiconductor Manufacturing Company Limited, Hsinchu (TW)

(72) Inventors: Hsueh-Wen Tsau, Miaoli County (TW); Chia-Ching Lee, New Taipei (TW); Mrunal A. Khaderbad, Hsinchu (TW); Da-Yuan Lee, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 26 days.

(21) Appl. No.: 14/141,619

(22) Filed: Dec. 27, 2013

(65) Prior Publication Data

US 2015/0187890 A1    Jul. 2, 2015

(51) Int. Cl.
*H01L 29/40*     (2006.01)
*H01L 21/461*    (2006.01)
*H01L 29/78*     (2006.01)
*H01L 29/66*     (2006.01)
*H01L 29/423*    (2006.01)

(52) U.S. Cl.
CPC .......... *H01L 29/401* (2013.01); *H01L 29/4236* (2013.01); *H01L 29/66795* (2013.01); *H01L 29/7855* (2013.01)

(58) Field of Classification Search
CPC ... H01L 21/31144; H01L 21/00; H01L 21/32; H01L 21/76202; H01L 21/762169
USPC .......................... 438/717, 736, 950, 448, 551
See application file for complete search history.

(56) References Cited

U.S. PATENT DOCUMENTS

| | | | | |
|---|---|---|---|---|
| 6,004,729 | A * | 12/1999 | Bae et al. | 430/317 |
| 9,034,748 | B2 * | 5/2015 | Baiocco | H01L 21/0332 257/E21.035 |
| 2003/0008490 | A1 * | 1/2003 | Xing et al. | 438/622 |
| 2015/0015174 | A1 * | 1/2015 | Atmur | 318/564 |
| 2015/0016174 | A1 * | 1/2015 | Liu | H01L 27/11206 365/96 |
| 2015/0064897 | A1 * | 3/2015 | Baiocco | H01L 21/0332 438/595 |

* cited by examiner

*Primary Examiner* — Bradley K Smith
*Assistant Examiner* — David Goodwin
(74) *Attorney, Agent, or Firm* — Jones Day

(57) ABSTRACT

A method is provided for forming a trench on a FinFET. In an exemplary embodiment, a first inter-layer dielectric layer is formed between a first gate and a second gate of the FinFET in an interposed manner. A second inter-layer dielectric layer is formed above the first inter-layer dielectric layer, the first gate of the FinFET, and the second gate of the FinFET. A photoresist layer is formed above the second inter-layer dielectric layer. And part of the second inter-layer dielectric layer that is not below the photoresist layer is etched.

20 Claims, 7 Drawing Sheets

METHOD OF FORMING TRENCH ON FINFET AND FINFET THEREOF

FIELD

The technology described in this patent document relates generally to a method of forming a trench on a semiconductor structure and the semiconductor structure thereof, and more particularly, a method of forming a trench on a fin field effect transistor (FinFET) and the FinFET thereof.

BACKGROUND

In a FinFET process, a trench is formed for depositing metal gate materials inside. However, in a conventional process of forming a trench on the FinFET, a tapered profile of the trench is easily introduced while patterning a dummy poly gate. The tapered profile may introduce voids within the trench after the trench is deposited with gate metal materials.

DETAILED DESCRIPTION

FIGS. 1-5 illustrate various cross-sectional views during the formation of a trench of a FinFET.

Figure 1:
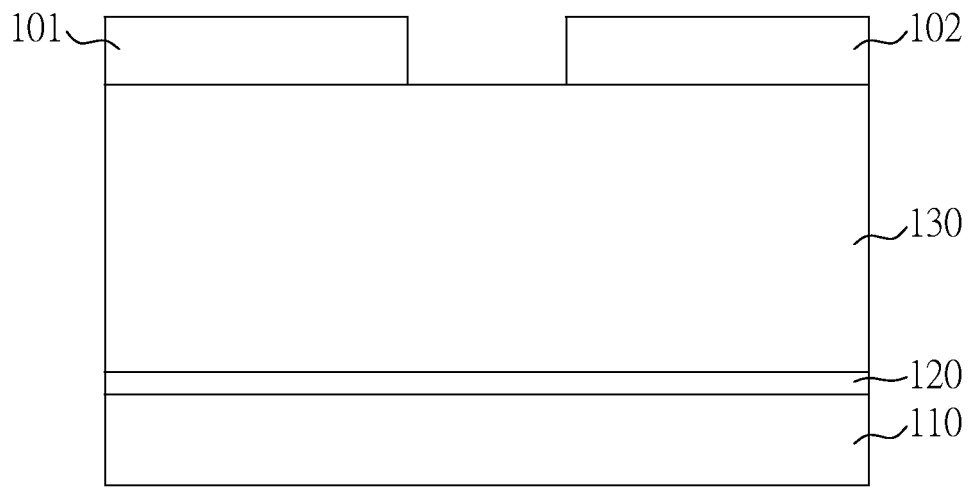
FIGS. 1-5 illustrate various cross-sectional views during the formation of a trench of a FinFET.

FIG. 1 shows that photo-resists 101 and 102 are formed on a poly layer 130 in a poly photolithography process. A gate oxide layer 120 is below the poly layer 130. A substrate layer 110 is below the gate oxide layer 120.

Figure 2:
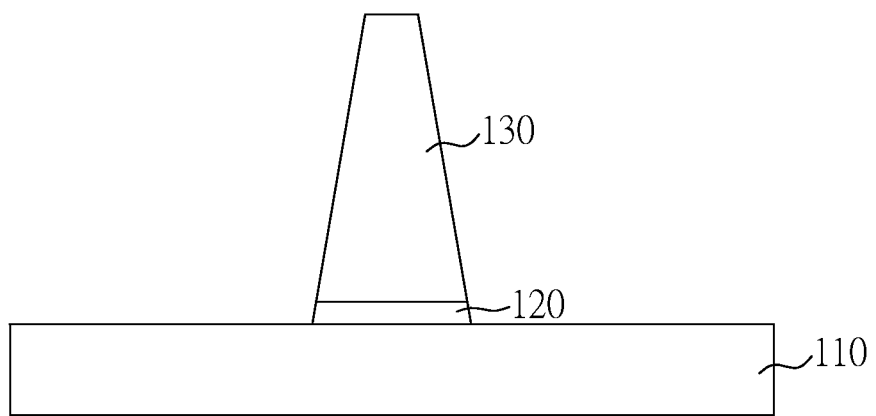

After completing a poly patterning process on the structure shown in FIG. 1, FIG. 2 shows a tapered portion of the poly layer 130 that acts as a dummy poly portion above the substrate layer 110.

Figure 3:
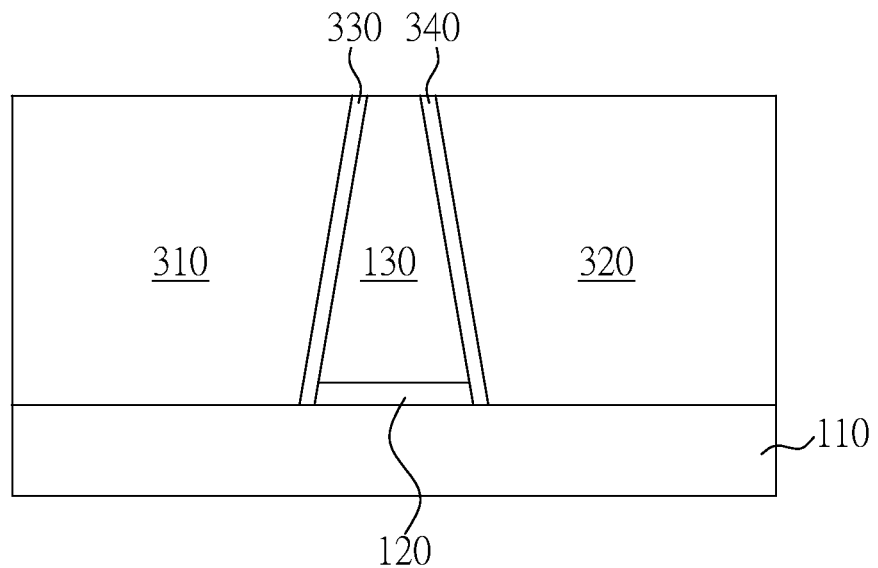

After performing an inter-layer dielectric (ILD) deposition process and an ILD chemical mechanical polishing (CMP) process on the structure shown in FIG. 2, FIG. 3 shows a plurality of portions of an ILD layer, for example, two ILD portions 310 and 320 interposed by the tapered portion of the poly layer 130. A first spacer 330 is formed between the ILD portion 310 and the tapered portion of the poly layer 130. A second spacer 340 is formed between the ILD portion 320 and the tapered portion of the poly layer 130.

Figure 4:
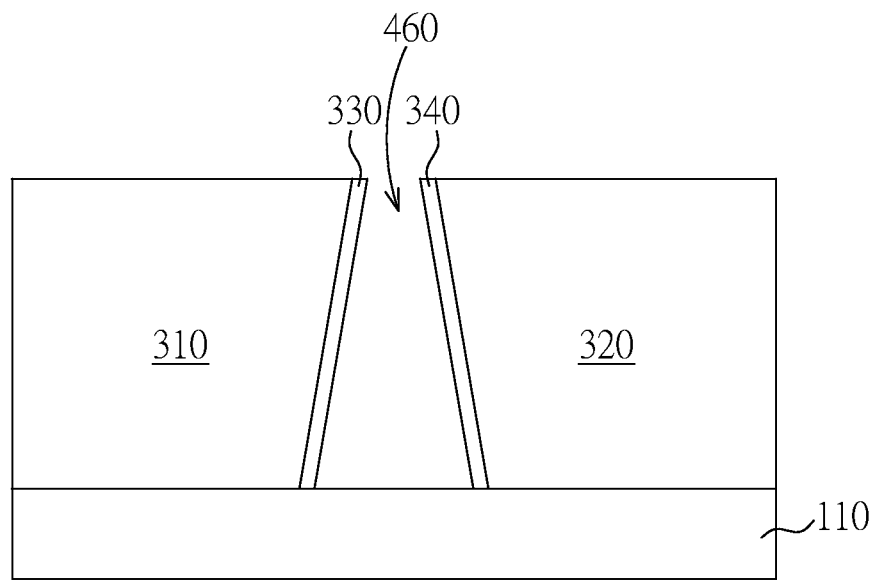

After performing a dummy poly removal process on the structure shown in FIG. 3, FIG. 4 shows the tapered portion of the poly layer 130 removed to form a trench 460.

Figure 5:
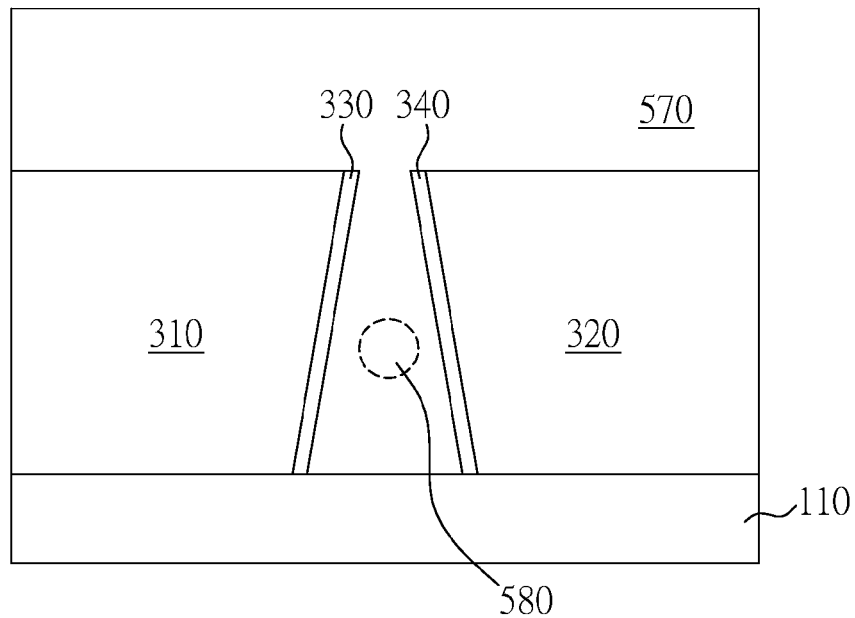

After performing a gate depositing process on the structure shown in FIG. 4, for example, using a high k/metal gate (HK/MG) process, FIG. 5 shows a metal gate layer 570 above and within the trench 460. Because of the tapered profile of the trench 460, some voids, such as a void 580 shown in FIG. 5, may also be introduced during the gate depositing process. These voids may significantly reduce conductivity of the metal gate layer 570.

For improving the conductivity issue caused by voids inside a metal gate layer in the abovementioned FinFET process, this disclosure teaches an improved method of forming a trench of a FinFET and the FinFET thereof.

Figure 6:
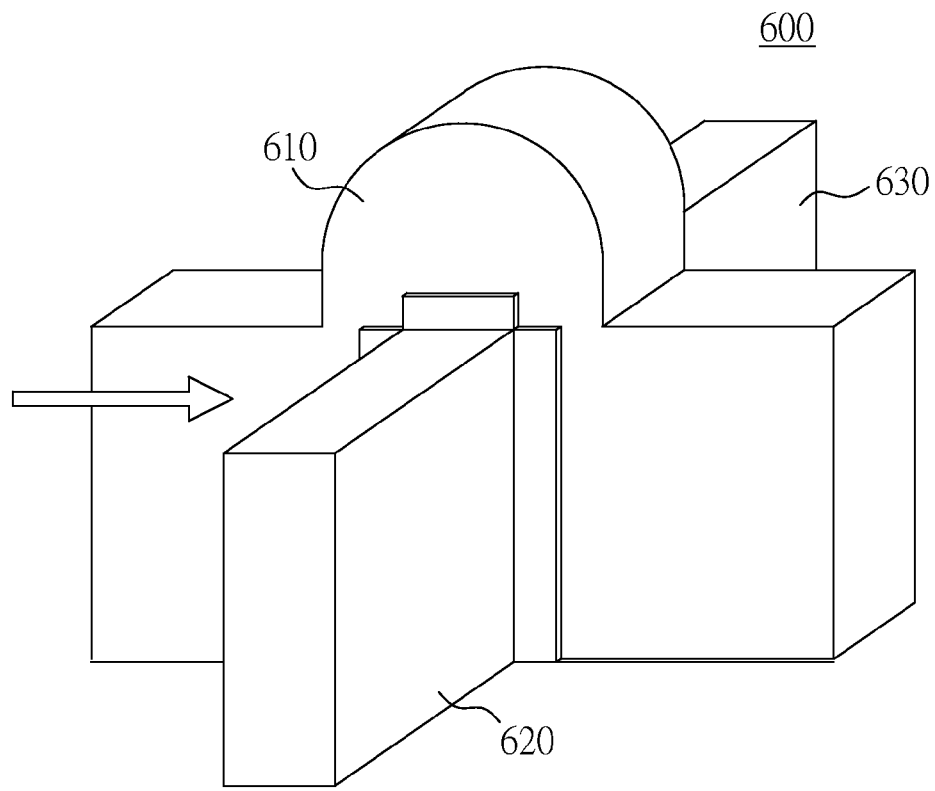
FIG. 6 illustrates a perspective view of an exemplary embodiment of a FinFET.

FIG. 6 illustrates a perspective view of an exemplary embodiment of a FinFET 600. The FinFET 600 includes a gate portion 610, a source portion 620, and a drain portion 630.

FIGS. 7-13 illustrate various cross-sectional views of part of the gate portion 610 during the formation of the embodiment of FIG. 6.

Figure 7:
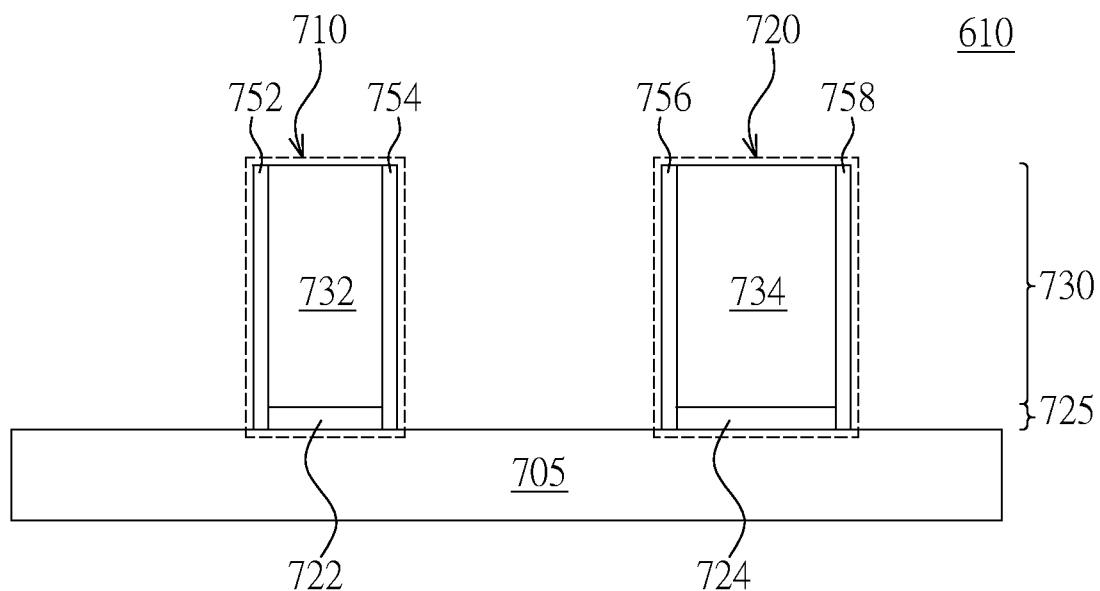
FIGS. 7-13 illustrate various cross-sectional views of part of a gate portion during the formation of the embodiment of FIG. 6.

In, FIG. 7, a substrate 705 is first formed. A gate oxide layer 725 is deposited on the substrate 705. A first poly layer 730 is deposited above the gate oxide layer 725. The gate oxide layer 725 and the first poly layer 730 are patterned for forming a body of the first gate 710 and the second gate 720 of the gate portion. The gate oxide layer 725 and the first poly layer 730 may include a plurality of separated portions after being patterned. For example, the body of the first gate 710 includes a first portion 732 of the first poly layer 730 and a first portion 722 of the gate oxide layer 725. The body of the second gate 720 includes a second portion 734 of the first poly layer 730 and a second portion 724 of the gate oxide layer 725.

Furthermore, some spacers may be disposed on lateral sides of the first gate 710 and the second gate 720. For example, a first spacer 752 may be formed adjacent to a first lateral side (e.g. a left side) of the body of the first gate 710. A second spacer 754 may be formed adjacent to a second lateral side (e.g. a right side) of the body of the first gate 710 opposite to the first lateral side of the body of the first gate 710. A third spacer 756 may be formed adjacent to a first lateral side (e.g. a left side) of the body of the second gate 720 confronting the second lateral side of the body of the first gate 710. A fourth spacer 758 may be formed adjacent to a second lateral side (e.g. right side) of the body of the second gate 720 opposite to the first lateral side of the body of the second gate 720.

A chemical mechanical polishing (CMP) procedure is optionally performed on the first gate 710 and the second gate 720 after forming the first spacer 752, the second spacer 754, the third spacer 756, and the fourth spacer 758. The CMP procedure is utilized for planarizing top surfaces of the first gate 710 and the second gate 720. And specifically, the CMP procedure is utilized for planarizing top surfaces of the first portion 732 of the first poly layer 730 and the spacers 752 and 754 and is also utilized for planarizing top surfaces of the second portion 734 of the first poly layer 730 and the spacers 756 and 758.

Figure 8:
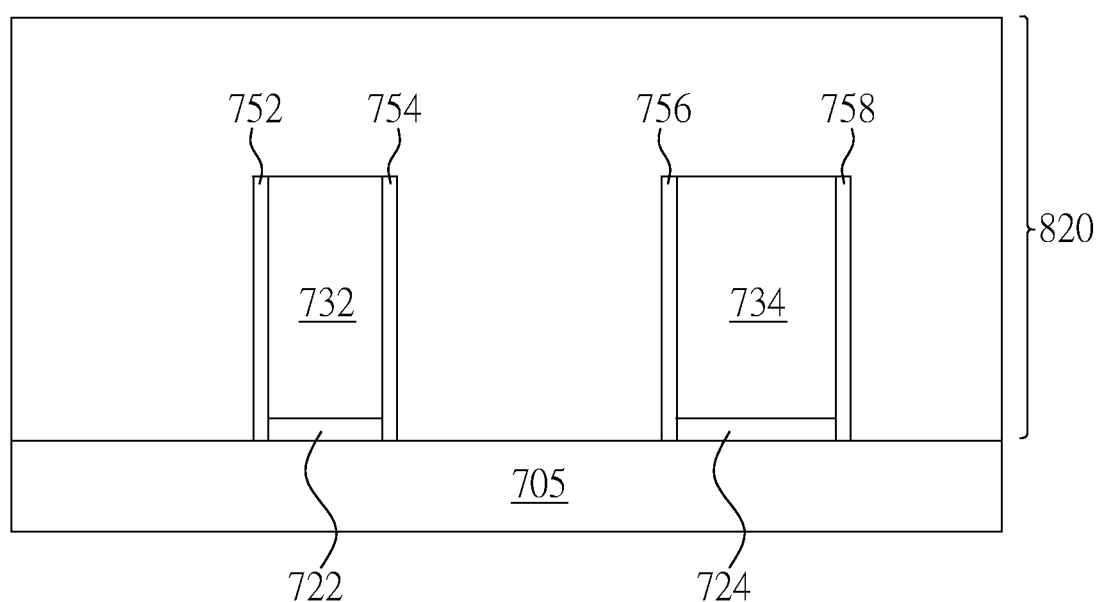

In FIG. 8, after the first gate and the second gate are formed in FIG. 7, an initial ILD layer 820 is further deposited on the part of the gate portion that was shown in FIG. 7.

Figure 9:
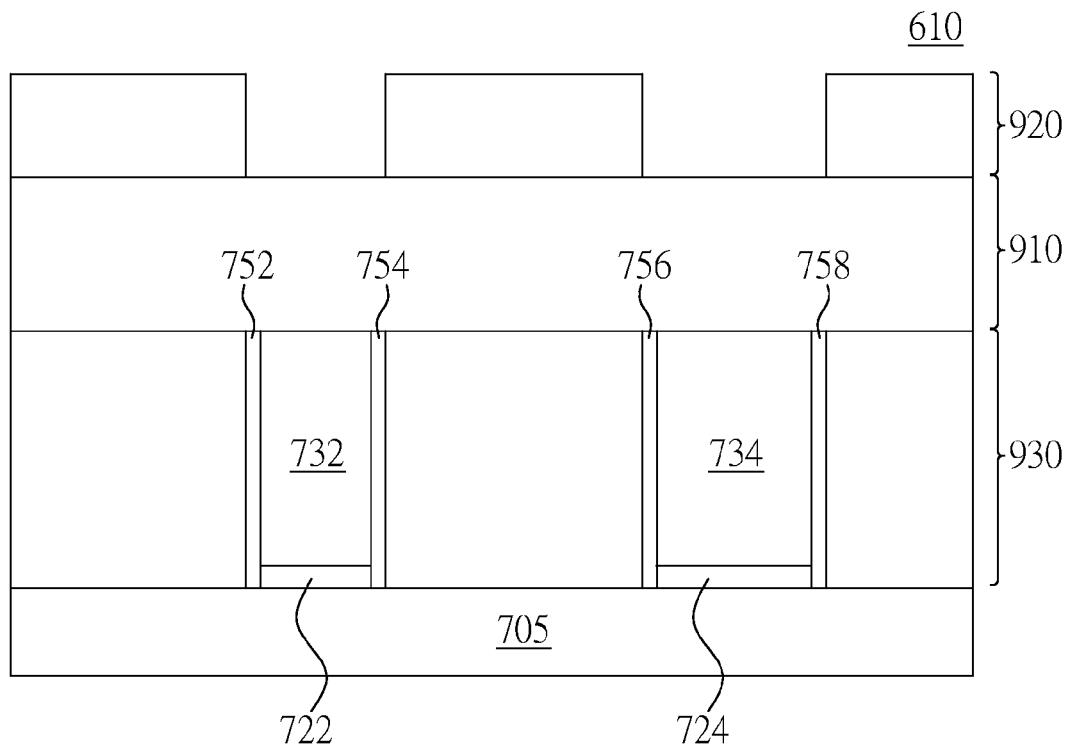

In FIG. 9, after the deposition of the initial ILD layer 820 is completed, the initial ILD layer 820 may be etched to form a first ILD layer 930. A CMP procedure is optionally performed on the first ILD layer 930 for planarization of the top surface of the first ILD layer 930 and for planarization of the top surfaces of the first gate and the second gate.

After forming the first ILD layer 930, a second ILD layer 910 is deposited above the first gate, the second gate, and the first ILD layer 930. A photoresist layer 920 is further patterned over the second ILD layer 910 for defining active regions above the first gate and the second gate.

Figure 10:
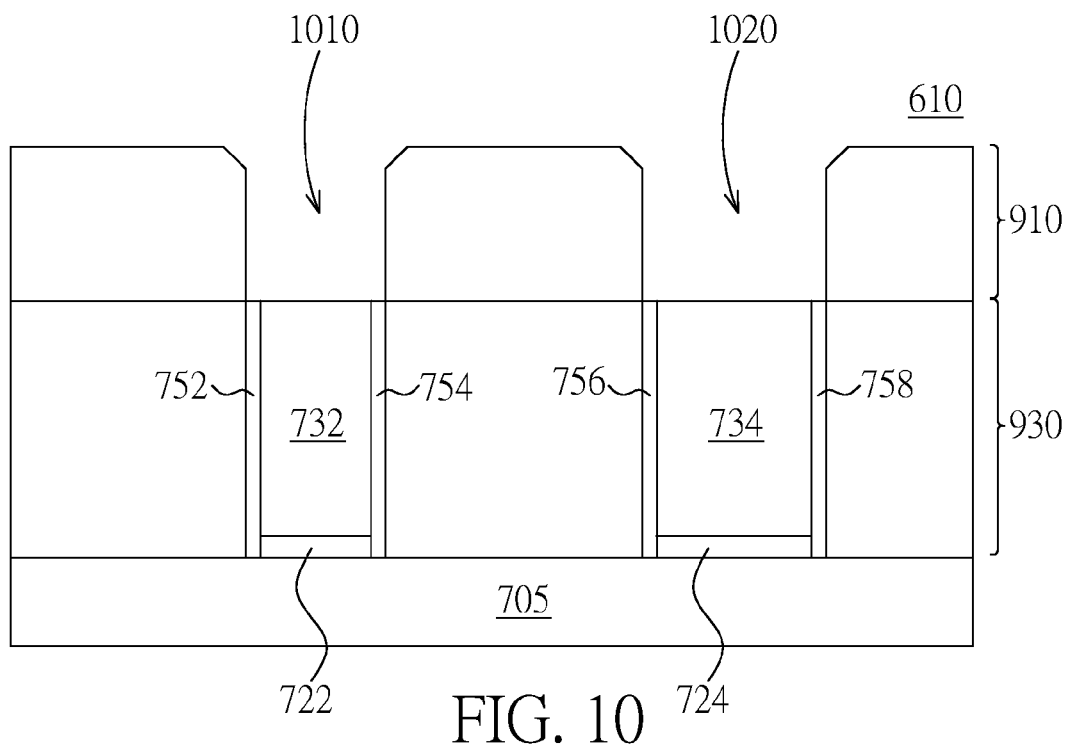

In FIG. 10, an etching process is performed on the part of the gate region shown in FIG. 9. After the etching process, part of the second ILD layer 910 that is not below the photoresist layer 920 is substantially etched for form a plurality of trenches, such as trenches 1010 and 1020. The photoresist layer 920 is also substantially removed. Corners of the second ILD layer 910 around the trenches 1010 and 1020 may be slightly etched as well.

In one embodiment, the etching process in FIG. 10 may be a dry etching process. In another embodiment, the etching process in FIG. 10 may be a wet etching process.

Figure 11:
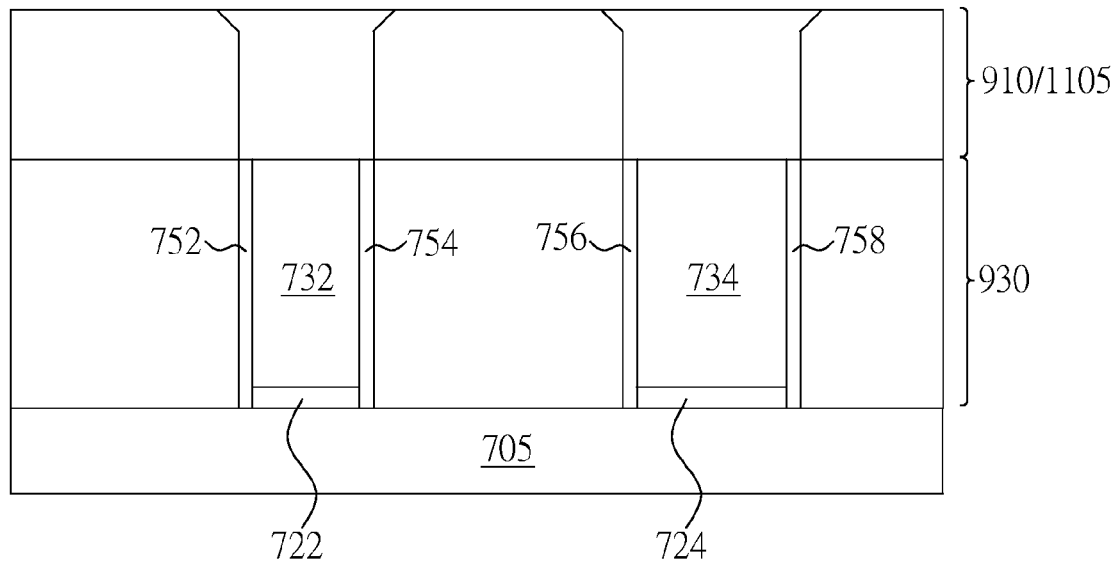

In FIG. 11, after the etching process shown in FIG. 10, a second poly layer 1105 may be deposited within the trenches 1010 and 1020 and above the first gate and the second gate. A CMP process is optionally performed on the top surfaces of the second ILD layer 910 and the second poly layer 1105 for planarization.

Figure 12:
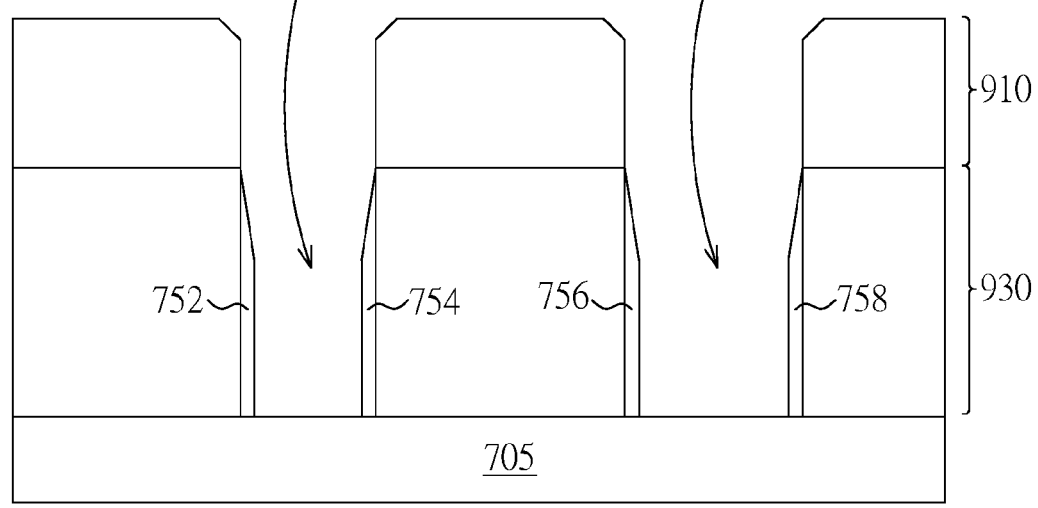

In FIG. 12, the first portion 732 and the second portion 734 of the first poly layer and the second poly layer 1105 are substantially etched to form a first trench 1201 and a second trench 1202. The first trench 1201 is defined for the first gate. The second trench 1202 is defined for the second gate. The portions 722 and 724 of the gate oxide layer are etched as well.

In one embodiment, the etching process in FIG. 12 may be a dry etching process. In another embodiment, the etching process in FIG. 12 may be a wet etching process.

Figure 13:
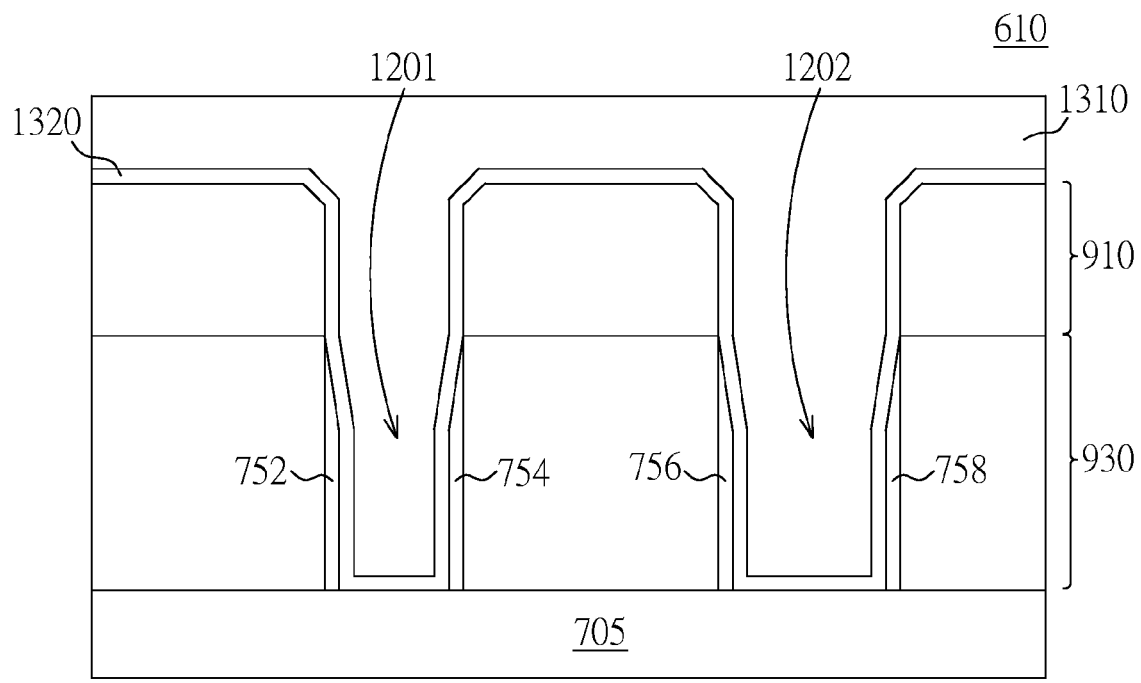

In FIG. 13, after depositing gate metal materials within the first trench 1201 and the second trench 1202, a gate metal material 1310 is deposited within the first trench 1201 and the second trench 1202 defined in the part of the gate region. A replacement gate process is completed after depositing the gate metal material 1310. An oxidation film 1320 may be substantially formed above the second ILD layer 910 and the spacers 752, 754, 756, and 758 before depositing the gate metal material 1310.

As can be observed from the process shown in FIGS. 7-13, the first trench 1201 and the second trench 1202 may be formed by two stages. A first stage is indicated by FIGS. 7-9 to perform the deposition of the first ILD layer 930 shown in FIG. 9. A second stage is indicated by FIGS. 9-10 to perform the deposition of the second ILD layer 910 shown in FIG. 10.

With the aid of the two-stage process, openings of the exemplary trenches between the portions 911 and 914 of the ILD layer 910 and a second trench between the portions in FIG. 10 will be broad enough. As a result, formation of voids will be reduced during the gate depositing process shown in FIG. 13. Conductivity of the gates can be well preserved after performing the gate depositing process. In other words, the tapered opening of the trench 460 shown in FIG. 4 is not introduced in the abovementioned embodiment.

One of ordinary skill in the art after reading this disclosure will appreciate that embodiments may also be formed by generating multiple trenches on a FinFET according to details of this disclosure.

Figure 14:
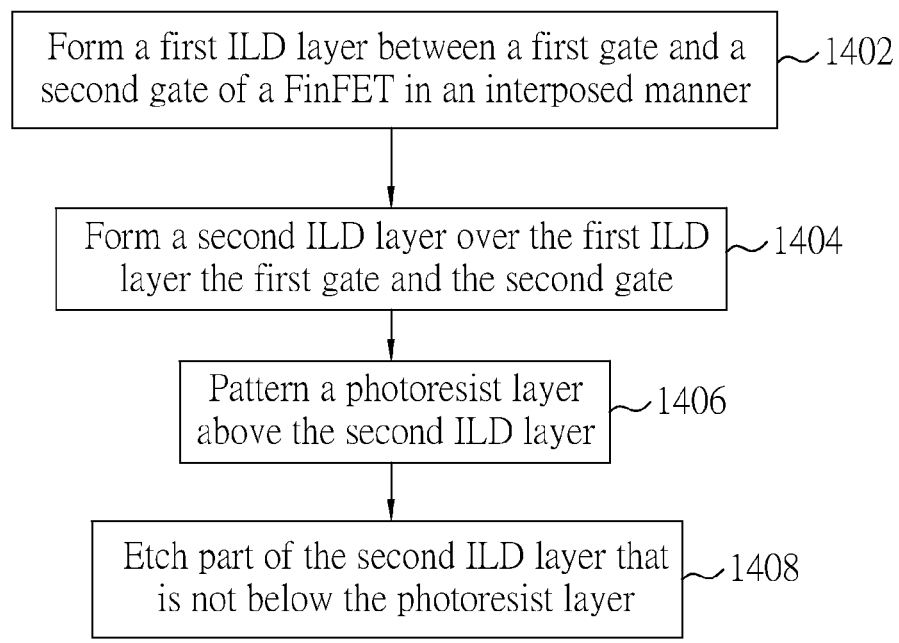
FIG. 14 illustrates of a flowchart of an exemplary method of forming a trench on a FinFET.

FIG. 14 illustrates a flowchart of an exemplary method of forming a trench on a FinFET based on descriptions and drawings related to FIGS. 6-13. The method includes the following stages: Form a first inter-layer dielectric layer 930 between a first gate 710 and a second gate of a FinFET in an interposed manner (1402). Form a second inter-layer dielectric layer 910 above the first inter-layer dielectric layer 820, the first gate of the FinFET, and the second gate of the FinFET (1404). Pattern a photoresist layer 920 over the second inter-layer dielectric layer 910 (1406). Etch part of the second inter-layer dielectric layer 910 that is not below the photoresist layer 920 (1408).

This disclosure teaches a method of forming a trench on a FinFET. In one embodiment, a first inter-layer dielectric layer is formed between a first gate and a second gate of the FinFET in an interposed manner. A second inter-layer dielectric layer is formed above the first inter-layer dielectric layer, the first gate of the FinFET, and the second gate of the FinFET. A photoresist layer is patterned over the second inter-layer dielectric layer. And part of the second inter-layer dielectric layer that is not below the photoresist layer is etched.

This disclosure also teaches a FinFET. In one embodiment, the FinFET comprises a first gate, a second gate, a first inter-layer dielectric layer, and a second inter-layer dielectric layer. The first inter-layer dielectric layer is formed between the first gate and the second gate in an interposed manner. The second inter-layer dielectric layer is patterned over the first inter-layer dielectric layer.

This disclosure further teaches a method of forming a trench on a FinFET. In one embodiment, a gate oxide layer is deposited on a substrate. A poly layer is deposited above the gate oxide layer. The gate oxide layer and the poly layer are patterned to form a body of the first gate of the FinFET and a body of the second gate of the FinFET. A first inter-layer dielectric layer is formed between the first gate and the second gate in an interposed manner. A second inter-layer dielectric layer is formed above the first inter-layer dielectric layer, the first gate of the FinFET, and the second gate of the FinFET. The photoresist layer is patterned over the second inter-layer dielectric layer. Part of the second inter-layer dielectric layer that is not below the photoresist layer is etched.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. As an example, the structures, layouts, materials, operations, voltage levels, or current levels related to "source" and "drain" described herein (including in the claims) may be interchangeable as a result of transistors with "source" and "drain" being symmetrical devices. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A method of forming a trench on a fin field effect transistor (FinFET), comprising:
   forming a first inter-layer dielectric layer over a first gate and a second gate of the FinFET;
   forming a second inter-layer dielectric layer above the first inter-layer dielectric layer, the first gate of the FinFET, and the second gate of the FinFET;
   patterning a photoresist layer over the second inter-layer dielectric layer;
   etching part of the second inter-layer dielectric layer that is not below the photoresist layer to expose the first gate and the second gate;
   forming a first polysilicon layer over the first gate and the second gate and in the second inter-layer dielectric layer; and
   removing the first gate and the second gate and the first polysilicon layer to form a first trench and a second trench through the first inter-layer dielectric layer and the second inter-layer dielectric layer.

2. The method of claim 1, further comprising:
   depositing a gate oxide layer on a substrate;
   depositing a second polysilicon layer above the gate oxide layer; and
   patterning the gate oxide layer and the second polysilicon layer to form a body of the first gate of the FinFET and a body of the second gate of the FinFET.

3. The method of claim 2, further comprising:
   forming a first spacer adjacent to a first lateral side of the body of the first gate of the FinFET; and
   forming a second spacer adjacent to a second lateral side of the body of the first gate of the FinFET opposite to the first lateral side of the body of the first gate of the FinFET.

4. The method of claim 3, further comprising:
   forming a third spacer adjacent to a first lateral side of the body of the second gate of the FinFET confronting the second lateral side of the body of the first gate of the FinFET; and
   forming a fourth spacer adjacent to a second lateral side of the body of the second gate of the FinFET opposite to the first lateral side of the body of the second gate of the FinFET.

5. The method of claim 4, further comprising:
   performing chemical mechanical polishing (CMP) on the first gate and the second gate of the FinFET after forming the first spacer, the second spacer, the third spacer, and the fourth spacer.

6. The method of claim 1, further comprising:
   performing chemical mechanical polishing on the first inter-layer dielectric layer after forming the first inter-layer dielectric layer over the first gate and the second gate of the FinFET.

7. The method of claim 1, further comprising:
   etching the photoresist layer while etching part of the second inter-later dielectric layer that is not below the photoresist layer.

8. The method of claim 7, wherein etching the photoresist layer while etching part of the second inter-later dielectric layer that is not below the photoresist layer comprises etching the photoresist layer using dry etching while etching part of the second inter-later dielectric layer that is not below the photoresist layer.

9. The method of claim 7, wherein etching the photoresist layer while etching part of the second inter-later dielectric layer that is not below the photoresist layer comprises etching the photoresist layer using wet etching while etching part of the second inter-later dielectric layer that is not below the photoresist layer.

10. The method of claim 1, wherein etching part of the second inter-layer dielectric layer that is not below the photoresist layer comprises etching part of the second inter-layer dielectric layer that is not below the photoresist layer using dry etching.

11. The method of claim 1, wherein etching part of the second inter-layer dielectric layer that is not below the photoresist layer comprises etching part of the second inter-layer dielectric layer that is not below the photoresist layer using wet etching.

12. A method of forming a trench on a fin field effect transistor (FinFET), comprising:
    depositing a gate oxide layer on a substrate;
    depositing a first polysilicon layer above the gate oxide layer;
    patterning the gate oxide layer and the first polysilicon layer to form a body of the first gate of the FinFET and a body of the second gate of the FinFET;
    forming a first inter-layer dielectric layer over the first gate and the second gate;
    forming a second inter-layer dielectric layer above the first inter-layer dielectric layer, the first gate of the FinFET, and the second gate of the FinFET;
    patterning a photoresist layer over the second inter-layer dielectric layer;
    etching part of the second inter-layer dielectric layer that is not below the photoresist layer to expose the first gate and the second gate;
    forming a second polysilicon layer over the first gate and the second gate and in the second inter-layer dielectric layer; and
    removing the first gate and the second gate and the second polysilicon layer to form a first trench and a second trench through the first inter-layer dielectric layer and the second inter-layer dielectric layer.

13. The method of claim 12, further comprising:
    etching the photoresist layer while etching part of the second inter-later dielectric layer that is not below the photoresist layer.

14. A method of forming a trench on a fin field effect transistor (FinFET), comprising:
    forming a first inter-layer dielectric layer over a first gate and a second gate of the FinFET;
    forming a second inter-layer dielectric layer above the first inter-layer dielectric layer, the first gate of the FinFET, and the second gate of the FinFET;

patterning a photoresist layer over the second inter-layer dielectric layer;
etching part of the second inter-layer dielectric layer that is not below the photoresist layer to expose the first gate and the second gate;
forming a first polysilicon layer over the first gate and the second gate and in the second inter-layer dielectric layer;
removing the first gate and the second gate and the first polysilicon layer to form a first trench and a second trench through the first inter-layer dielectric layer and the second inter-layer dielectric layer;
forming an oxidation film within the first trench and the second trench; and
forming a gate metal layer over the oxidation film.

15. The method of claim 14, further comprising:
forming a first spacer adjacent to a first lateral side of the body of the first gate of the FinFET; and
forming a second spacer adjacent to a second lateral side of the body of the first gate of the FinFET opposite to the first lateral side of the body of the first gate of the FinFET.

16. The method of claim 15, further comprising:
forming a third spacer adjacent to a first lateral side of the body of the second gate of the FinFET confronting the second lateral side of the body of the first gate of the FinFET; and
forming a fourth spacer adjacent to a second lateral side of the body of the second gate of the FinFET opposite to the first lateral side of the body of the second gate of the FinFET.

17. The method of claim 16, further comprising performing chemical mechanical polishing (CMP) on the first gate and the second gate of the FinFET after forming the first spacer, the second spacer, the third spacer, and the fourth spacer.

18. The method of claim 14, further comprising performing chemical mechanical polishing on the first inter-layer dielectric layer after forming the first inter-layer dielectric layer over the first gate and the second gate of the FinFET.

19. The method of claim 14, further comprising etching the photoresist layer while etching part of the second inter-later dielectric layer that is not below the photoresist layer.

20. The method of claim 19, wherein etching the photoresist layer while etching part of the second inter-later dielectric layer that is not below the photoresist layer comprises etching the photoresist layer using dry etching while etching part of the second inter-later dielectric layer that is not below the photoresist layer.

* * * * *